United States Patent [19]

Sugawara et al.

[11] Patent Number: 4,794,441
[45] Date of Patent: Dec. 27, 1988

[54] SEMICONDUCTOR SWITCH CIRCUIT

[75] Inventors: Yoshitaka Sugawara, Hitachi; Junjiro Kitano, Fujisawa; Tadakatsu Kimura, Ebina; Yasunobu Inabe, Atugi; Masa-aki Tanabe, Kodaira, all of Japan

[73] Assignees: Hitachi Ltd.; Nippon Telegraph & Telephone, both of Tokyo, Japan

[21] Appl. No.: 748,199

[22] Filed: Jun. 24, 1985

[30] Foreign Application Priority Data

Jun. 22, 1984 [JP] Japan ................... 59-127491
Sep. 3, 1984 [JP] Japan ................... 59-182665

[51] Int. Cl.$^4$ ............... H01L 29/74; H01L 29/747; H01L 27/02; H01L 29/78
[52] U.S. Cl. ..................... 357/38; 357/39; 357/43; 357/23.4; 357/23.12
[58] Field of Search .......... 357/38 GT, 39 T, 43, 357/23.4, 23.12

[56] References Cited

U.S. PATENT DOCUMENTS

| | | | |
|---|---|---|---|
| 3,401,319 | 9/1968 | Watkins | 357/43 |
| 3,753,055 | 8/1973 | Yamashita | 357/38 |
| 4,199,774 | 4/1980 | Plummer | 357/38 |
| 4,330,849 | 5/1982 | Togei et al. | 357/38 |
| 4,581,543 | 4/1986 | Herberg | 357/38 |
| 4,595,941 | 6/1986 | Avery | 357/38 |

FOREIGN PATENT DOCUMENTS

| | | | |
|---|---|---|---|
| 46589 | 7/1978 | Japan . | |
| 196626 | 3/1982 | Japan . | |
| 208177 | 12/1982 | Japan | 357/38 T |
| 208176 | 12/1982 | Japan | 357/38 T |

Primary Examiner—Martin H. Edlow
Assistant Examiner—Robert P. Limanek
Attorney, Agent, or Firm—Antonelli, Terry & Wands

[57] ABSTRACT

A semiconductor switch circuit of field-drive type includes a bipolar component having forward blocking and reverse blocking junctions, and p-channel and n-channel IGPETS connected across the bipolar component so as to short-circuit its forward blocking junction. The switch circuit operates to turn on or off in response to the voltage signal to the gate circuit which is isolated from the bipolar component, irrespective of the polarity of a voltage applied across the bipolar component.

12 Claims, 6 Drawing Sheets

SEMICONDUCTOR SWITCH CIRCUIT

BACKGROUND OF THE INVENTION

The present invention relates to a semiconductor switch circuit of field-drive type in which the main drive section is isolated electrically from its control section.

With the ever progressing electronic technologies in extensive fields of industry, there is an increasing demand for devices which are capable of controlling a large amount electric power with a small control signal, with electrical isolation being made between the control section and the main drive section of the device. Typical semiconductor devices that meet the demand are photo-coupling devices known as "photocouplers". Among such devices, photo-coupling thyristors having superior features such as: (1) forward and reverse blocking ability, (2) small power loss after switching, and (3) self-holding ability, are used extensively for switches of electronic exchange and solid state relays. The photo-coupling thyristor, however, has some crucial problems as will be described in the following.

FIG. 1 shows the basic arrangement of a switch circuit including a photo-coupling thyristor. With a switch 1 being closed, a current flows in a light emitting device 2, and it radiates the light. The light emission causes a photo-thyristor 3 to produce a photocurrent, and when the photo-thyristor is forwardly biased by an a.c. power source 4, it is turned on by the photocurrent. Reference numbers 5, 6 and 7 denote resistors. This arrangement, with the photo-thyristor and light emitting device isolated electrically, has the following advantages in contrast with the usual electrical coupling systems.

(a) There can be a voltage difference between terminals B and D in controlling the conducting operation.

(b) The currents flowing in the light emitting component 2 and in the thyristor circuit are totally independent.

On the other hand, the above arrangement has the following drawbacks.

(1) The photo-thyristor 3 and transistor 1 are made of silicon, while the light emitting device 2 is made of compound semiconductor of III–V group or II–VI group, typically GaAs. Due to different materials used, the device needs to be fabricated in a hybrid integrated circuit that requires precise assembling work, and therefore the cost is high. The fact that the processing technology of compound semiconductor wafers lagging behind that of silicon wafer technology also contributes to high cost.

(2) Efficiencies are low in generating the light by the light emitting diode, transmitting the light to the photo-thyristor and receiving the light by the photo-thyristor. A low total photo-coupling efficiency requires a large control current of several milliamperes in the light emitting diode for activating the photo-thyristor.

Japanese Patent Examined Publications Nos. 42-24863 and 53-46589 disclose arrangements for activating a pnpn component by a MOS gate or MOS FET. Japanese Patent Unexamined Publication No. 57-196626 discloses an arrangement for turning on and off a pnpn component by a MOS FET. Although in any of the above cases the gate section is isolated from the main switch section, the main switch in a floating state cannot be turned on. Namely, the main switch is turned on only when the gate voltage is higher or lower than the cathode voltage of the main switch, and these arrangements do not function identically to the photocoupler.

SUMMARY OF THE INVENTION

An object of this invention is to provide a field-drive semiconductor switch circuit arranged in a monolithic integrated circuit, with the main drive section being isolated from the control section.

Another object of this invention is to provide a field-drive semiconductor switch circuit operable to control the main drive section even in a floating state.

Still another object of this invention is to provide a field-drive semiconductor switch circuit operable to drive the main drive section by a small control current.

To achieve the foregoing objectives this invention primarily features a bipolar component having a forward blocking junction and a reverse blocking junction, a unipolar device of one conductivity type operable to short-circuit the forward blocking junction of the bipolar component, and a unipolar device of another conductivity type operable to short-circuit the reverse blocking junction of the bipolar component.

According to a preferred form of this invention, the bipolar component is a bipolar transistor or thyristor.

According to a preferred form of this invention, the semiconductor device consists of a plurality of bipolar transistors.

According to a preferred form of this invention, the unipolar components of one and another conductivity types have their control terminals connected with each other.

According to a preferred form of this invention, the unipolar components are insulated-gate field effect transistors.

According to a preferred form of this invention, the unipolar components two different conductivity types have their main terminals connected to regions of opposite conductivity types of the bipolar component; otherwise, the unipolar components are connected in parallel with each other.

According to a preferred form of this invention, a region for forming the bipolar component and a region for forming the unipolar components are integrated in a common region.

This invention resides, as the second feature, in a semiconductor device including a bipolar component having at least one forward blocking junction and at least one reverse blocking junction, wherein the device further includes first unipolar components of one conductivity type and opposite conductivity type connected to short-circuit at least one of the forward blocking junctions, and second unipolar components of one conductivity type and opposite conductivity type connected to short-circuit at least one of the reverse blocking junctions.

According to a preferred form of this invention, the bipolar component is a thyristor.

According to a preferred form of this invention, the first unipolar components of one conductivity type and opposite conductivity type have their control terminals connected with each other, and the second unipolar components of one conductivity type and opposite conductivity type have their control terminals connected with each other.

According to a preferred form of this invention, the first unipolar components of one conductivity type and opposite conductivity type are connected in parallel, and the second unipolar components of one conductivity type and opposite conductivity type are connected in parallel.

BRIEF DESCRIPTION OF THE DRAWINGS

FIGS. 2a, 2b and 2c are a set of schematic diagrams of the semiconductor switch circuit embodying the present invention, wherein FIG. 2a shows the basic circuit arrangement, FIG. 2b shows the arrangement of junctions of the semiconductor device, and FIG. 2c shows the equivalent circuit;

FIG. 3 is a diagram showing symbolically the semiconductor switch circuit with the internal connection shown in FIG. 2a;

DESCRIPTION OF THE PREFERRED EMBODIMENTS

Figure 1:
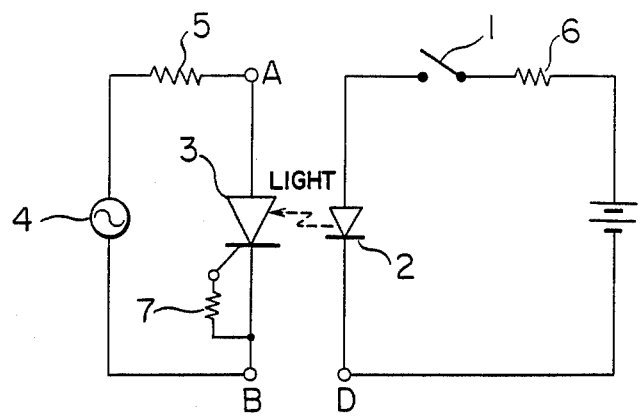
FIG. 1 is a schematic diagram showing the conventional semiconductor switch circuit employing a photocoupler.
Figure 2A:
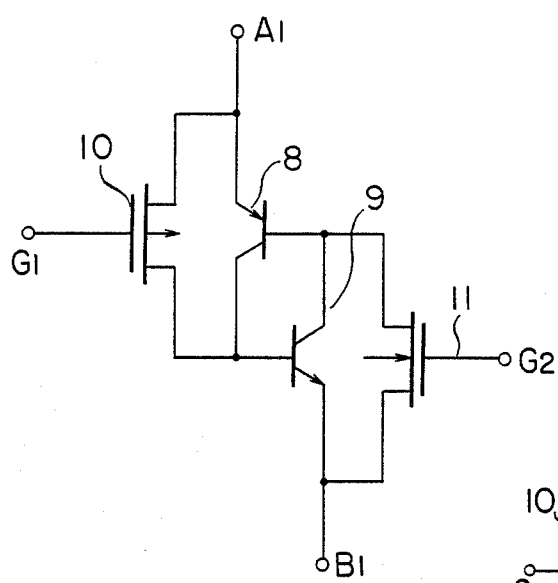
Figure 2C:
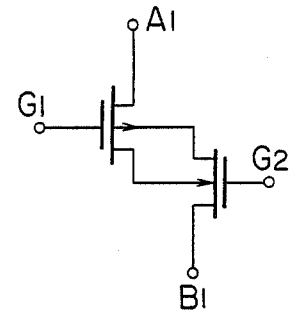
Figure 2B:
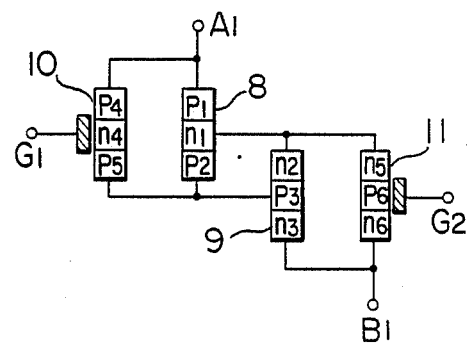

In FIGS. 2a and 2b, a bipolar component is embodied by a pnp bipolar transistor of current control type 8 made up of three layers p1, n1 and p2, with its emitter junction p1n1 and collector junction n1p2 forming a reverse blocking junction and forward blocking junction, respectively. An npn bipolar transistor of current control type 9 is made up of three layers n2, p3 and n3, and its collector junction n2p3 and emitter junction p3n3 form a forward blocking junction and reverse blocking junction, respectively. The base n1 of the pnp transistor 8 and the collector n2 of the npn transistor 9 are connected by wiring, while the collector n2 of the pnp transistor 8 and the base p3 of the npn transistor 9 are connected by wiring. A unipolar component is embodied by a p-channel insulated-gate field effect transistor (will be termed simply p-channel MOS FET) 10, with its source p4 and drain p5 being connected by wiring to the emitter p1 and collector p2 of the pnp transistor 8 so as to short-circuit the forward blocking junction, i.e., collector junction n1p2. Another unipolar component is embodied by an n-channel insulated-gate field effect transistor (will be termed simply n-channel MOS FET) 11, with its drain n5 and source n6 being connected by wiring to the collector n2 and emitter n3 of the npn transistor 9 so as to short-circuit at least the forward blocking junction, i.e., collector junction n2p3.

Figure 3:
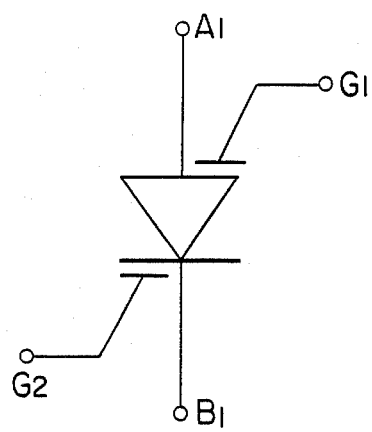

In FIG. 2b, the pnp transistor 8 and p-channel MOS FET 10 have the same arrangement of junctions, and the ppp transistor 9 and n-channel MOS FET 11 have the same arrangement of junctions. On this account, the overall structure can be expressed in the equivalent circuit as shown in FIG. 2c. The pnp transistor 8 and npn transistor 9 are in connection to form the equivalent circuit of a thyristor, and therefore the arrangements of FIGS. 2a, 2b and 2c are considered to be a thyristor incorporating insulated-gate field effect transistors on the n base and p base, as expressed symbolically in FIG. 3.

The p-channel MOS FET 10 is adapted to short-circuit directly the forward blocking junction of the pnp transistor 8, while the n-channe MOS FET 11 is adapted to short-circuit the forward blocking junction of the pnp transistor 8 through the reverse blocking junction, i.e., emitter junction p3n3, of the npn transistor 9. The pnp transistor 8, npn transistor 9, p-channel MOS FET 10 and n-channel MOS FET 11 can be realized by being formed independently in a plurality of monocrystalline islands on a dielectric isolating substrate produced by the epitaxial passivated integrated circuit (EPIC) process as disclosed for example in IEEE Transactions on Electron Devices, Vol. ED-15, No. 9, p. 645, 1968, by F. H. Lee, and thereafter by being wired between the islands using aluminum conductors formed on the substrate. In this case, other components including a switch 1 made of npn transistor, and resistors 5 and 7 can be formed integrally on other monocrystalline islands on the common dielectric isolating substrate.

The principle of operation of this embodiment will be described using FIGS. 2a, 2b, 2c and 4. With the switch 1 being open, the current path between terminals A1 and B1 is in a non-conductive state. When the switch 1 is closed, a voltage higher than the threshold voltages of the MOS FETs 10 and 11 is applied to terminals G1 and G2 by a voltage source 15. If the device is brought to a forward-bias state, i.e., the voltage at A1 is sufficiently higher than the voltage at B1, the device between A1 and B1 is made conductive. The conduction is achieved irrespective of the voltage relation between terminals G1 and G2 and terminals A1 and B1. In this case, if terminal B1 is floating electrically, different operating processes take place depending on the voltage relation between terminals G1 and G2 and terminals A1 and B1 as will be described separately in the following.

(I) G1 and G2 lower in voltage than A1 and B1: (For example, switch 12 is set to select voltage source 13.)

In this case, the n-channel MOS FET 11 is cut off, while the p-channel MOS FET 10 is conductive. Consequently, a current flows thoough the p-channel MOS FET 10 to the base p3 of the npn transistor 9, causing it to become conductive. Then, a current flows from A1 to the emitter junction n1p1 of pnp transistor 8, to the npn transistor 9, and to B1, and the current path between A1 and B1 is made conductive. Since the npn transistor 9 and pnp transistor 8 have their collector currents used as base currents of the opposing transistors, the provision of a large current amplification for both transistors brings themselves into saturation due to positive feedback. On this account, the current path between A1 and B1 is brought into a much deeper conductive state.

(II) G1 and G2 higher in voltage than A1 and B1: (For example, switch 12 is set to select voltage source 14 which is higher than the voltage of a.c. voltage source 4.)

In this case, the p-channel MOS FET 10 is cut off, while the n-channel MOS FET 11 is conductive. Consequently, a current flows through the n-channel MOS FET 11 to the base of the pnp transistor 8, causing it to become conductive. Then, a current flows from A1 to the pnp transistor 8, to the emitter junction p3n3 of npn transistor 9, and to B1, and the current path between A1 and B1 is made conductive. Through the provision of large current amplification for both transistors, the current path between A1 and B1 enters a much deeper conductive state by the effect of positive feedback as in case I.

(III) G1 and G2 higher in voltage than B1, but lower than A1:

In this case, both the p-channel MOS FET 10 and n-channel MOS FET 11 are conductive. Consequently, both phenomena mentioned in the above cases I and II arise, and the current path between A1 and B1 is made conductive.

Accordingly, this embodiment allows the control of the switching operation even if a voltage difference exist between the control section and the main drive section. The embodiment employs, as a control means, unipoar MOS FETs having the gate electrode and source-drain channel interposed by an insulation film such as an oxide film, whereby electrical insulation in a sense of direct current can be accomplished between the control section and main drive section. The insulator withstand voltage depends on the quality and thickness of the gate insulation film, and it is generally in a conflicting relationship with the threshold voltage. Nevertheless, by providing a low impurity concentration (e.g., around $1 \times 10^{14}$ cm$^{-3}$) in the channel section and a large thickness (e.g., around 1 $\mu$m) for the oxide film, it is possible to have an insulation voltage as high as 1000 volts and a threshold voltage as low as 5 volts at the same time. Through the provision of dielectric isolation between islands using the EPIC process, an insulation voltage between components of higher than 1000 volts is accomplished. The control circuit required is as small as a displacement current which suffices to charge and discharge the gate capacitance (the capacitance of the insulation film placed between the gate electrode and channel section, and the like), ranging generally in the order of microamperes, which is smiller by the order of 1/1000 than photo-coupling devices.

This embodiment allows the main drive section operating for main drive current of 100 mA under an a.c. power source of 100 volts in 10 kHz to be controlled by use of a 5-volt signal power source. The on-voltage in the conductive state is about 1.4 volts, and the input-/output withstand voltage is 1000 volts, for example.

As can be seen from the above description, this embodiment enables fabrication of the control and main drive sections using the same material in a monolithic structure, d.c. isolation between both sections, and control of a main circuit by a small current.

Figure 5:
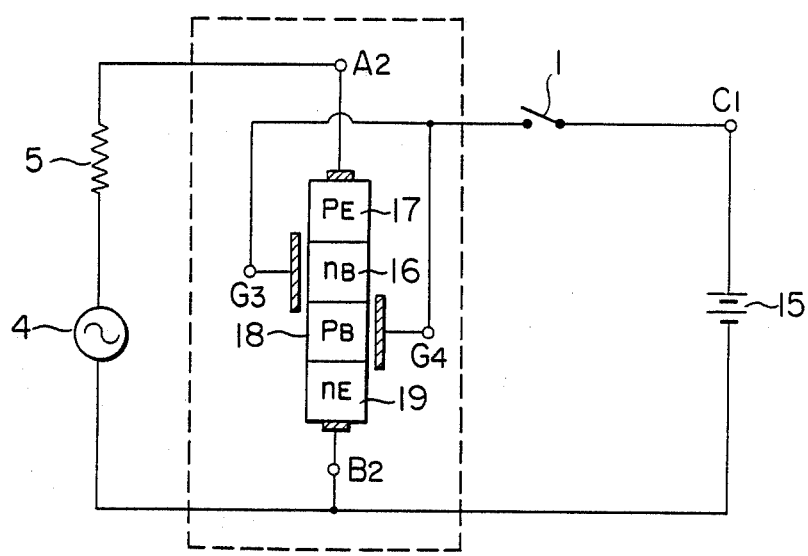
FIG. 5 is a schematic diagram showing the second embodiment of this invention.

FIG. 5 shows the second embodiment of this invention, in which the arrangement within the block of dashed line is an integration of the components shown in FIGS. 2a, 2b and 2c that constitute a thyristor. Namely, a p-emitter (PE) 17 is shared by p1 of pnp transistor 8 and p4 of p-channel MOS FET 10 in FIG. 2b; an n-base (NE) 16 is shared by n1 of pnp transistor 8, n2 of npn transistor 9, n4 of p-channel MOS FET 10 and n5 of n-channel MOS FET 11; a p-base (PB) 18 is shared by p2 of pnp transistor 8, p3 of npn transistor 9, p5 of p-channel MOS FET 10 and p6 of n-channel MOS FET 11; and an n-emitter (NE) 19 is shared by n3 of npn transistor 9 and n6 of n-channel MOS FET 11. The nBpB junction is a forward blocking junction, and pEnB junction and pBnE junction are reverse blocking junctions.

In operation, when the switch 1 is open, the current path between terminals A2 and B2 is in a non-conductive state. When the switch 1 is closed, a voltage higher than the threshold voltage is applied to control terminals G3 and G4 by the voltage source 15. When the device is forward biased between A2 and B2 by the a.c. voltage source 4, it turns on. In this case, the device between A2 and B2 is made conductive irrespective of the voltage relation between the control terminals F3 and G4 and the terminals A2 and B2, but in different operating manners depending on the voltage relation.

In case the voltage of G3 and G4 is lower than the voltages of A2 and B2, a p-channel is formed on the surface of nB 16 beneath the G3 electrode 15, and holes flow from pE 17 to pB 18. Consequently, injection of electrons from nE 19 to pB 18 is promoted, causing an nEpBnB transistor section to become conductive, and electrons flow into nB. Therefore, injection of holes from pE 17 to nB 16 is promoted, causing a pEnBpB transistor to become conductive. The collector currents of the nEpBnB and pEnBpB transistor sections are the base currents of the opposing transistors, and as a result of a positive feedback action the whole part turns on as a pEnBpBnE thyristor.

In another case where the voltage of G3 and G4 is higher than the voltages of A2 and B2, an n-channel is formed on the surface of pB beneath the G4 electrode, and electrons flow from nE 19 to nB 16. Consequently, injection of holes from pE 17 to nB 16 is promoted, causing a pEnBpB transistor section to become conductive, and holes flow into pB 18. Therefore, injection of electrons from nE 19 to pB 18 is promoted, causing an nEpBnB transistor section to become conductive. Then, by a positive feedback action the pEnBpBnE thyristor turns on.

With the voltage of G3 and G4 being higher than the voltage of B2 and lower than the voltage of A2, the operations of the above two cases occur concurrently and the pEnBpBnE thyristor turns on.

Next, the electrical characteristics and features of the semiconductor device of this embodiment will be described. The breakdown voltaee of the device between terminals A2 and B2 is about 100 volts, and the d.c. insulation voltage between terminals G3 and G4 and terminals A2 and B2 is about 650 volts. With a resistor of 10 kΩ connected between pB and nE so as to enhance the noise immunity of the device, the device between A2 and B2 can be turned on by application of about 4 volts to terminal G3, or by application of about 7 volts to terminal G4. Accordingly, when terminals G3 and G4 are connected together, a gate voltage of about 7 volts is needed to turn on the device. The voltage difference between A2 and B2 of the turned-on device, i.e., on-voltage with a current conduction of 100 mA is approximately 1.25 volts.

This embodiment has the following features in addition to those of the first embodiment. The arrangement of composite integration requires a smaller area (e.g., approx. 300 $\mu$m by 300 $\mu$m), and it is beneficial to a higher integration of the circuit. Whereas, the first embodiment uses a larger number of components and needs additional areas for isolating components, resulting in a total area about 2.8 times that of the second embodiment to achieve a comparable performance.

Figure 6:
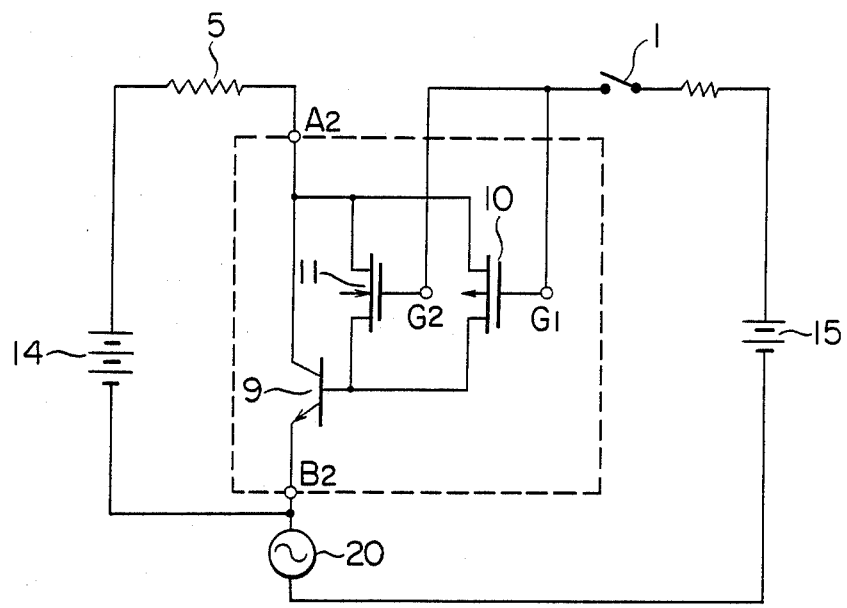
FIGS. 6 through 11 are schematic diagrams showing the third though 11th embodiments of this invention, respectively.

FIG. 6 shows the third embodiment of this invention, in which the arrangement within the block of dashed line differs from the preceding embodiments. The arrangement iccludes an npn transistor 9, a p-channel MOS FET 10 having its source and drain connected to the collector and base of the npn transistor 9 so as to short-circuit the forward blocking junction, i.e., collector junction, of the transistor 9, and an n-channel MOS FET 11 having its source and drain connected to the collector and base of the transistor 9 in parallel to the p-channel MOS FET 10 so as to short-circuit the collector junction of the npn transistor 9. These components are formed independently in separate crystalline islands of a dielectric isolation substrate produced by the EPIC process, and wiring is made between them using aluminum conductors to complete a monolithic integrated circuit. Control terminals G1 and G2 are connected together to the switch 1.

In fabricating the arrangement in a monolithic integrated circuit, each component formed in a monocrystalline island has a high breakdown voltage above 250 volts. The npn transistor 9 has a usual known structure, the n-channel MOS FET 11 is a high voltage vertical FET having a structure as disclosed in publication "Digest of ISSCC", p. 238, Feb. 1981, by W. H. A. Mattheus, and the p-channel MOS FET 10 is a high voltage lateral FET having a structure as disclosed in a semiconductor transistor committee report "High voltage MOS FET", SSD73-14, June 1973, by Yoshida et al.

In FIG. 6, when the switch 1 is open, the transistor 9 in any bias condition is not supplied with a base current, and the current path between A2 and B2 is in a non-conductive state. When the switch 1 is closed so that a voltage higher than the threshold voltage of MOS FETs 10 and 11 is applied to the control terminals G1 and G2 by the voltage source 15, the npn transistor 9 becomes conductive. In this case, a voltage source 20 operates on the npn transistor 9 to become conductive, even though the terminals A2 and B2 are floating, irrespective of the voltage relation between the control terminals G1 and G2 and the terminals A2 and B2, but in different operating manners depending on the voltage relation between the terminals, as follows.

In case the control terminals G1 and G2 are lower in voltage than the terminals A2 and B2, the MOS FETs 10 and 11 have a higher source-drain voltage than the gate voltage. Accordingly, the n-channel MOS FET 11 is non-conductive, and the p-channel MOS FET 10 is conductive. Consequently, the source-drain current of the p-channel MOS FET 10 flows into the base of the npn transistor 9, causing it become conductive.

In another case, if the control terminals G1 and G2 are higher in voltage than the terminals A2 and B2, the MOS FETs 10 and 11 have a higher source-drain voltage than the gate voltage. Accordingly, the p-channel MOS FET 10 is non-conductive, and the n-channel MOS FET 11 is conductive. Consequently, the npn transistor 9 is supplied with a base current, and it becomes conductive.

In case the control terminals G1 and G2 are higher in voltage than the terminal B2, but lower than the terminal A2, the operation of one of the above two cases takes place, causing the npn transistor 9 to become conductive.

According to this embodiment, the npn transistor 8 of the main drive section is surely driven even if the main terminals A2 and B2 are in a floating state. The forward breakdown voltage between A2 and B2 is about 260 volts, and the insulation voltage between the terminals A2 and B2 and the control terminals G1 and G2 is about 600 volts. The threshold voltage for turning on the device is about 3.5 volts, and the on-resistance with a current conduction of 10 mA is about 15 Ω.

Figure 7:
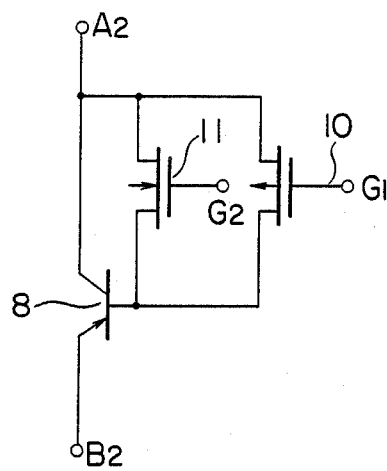

FIG. 7 shows the fourth embodiment of this invention, which differs from the previous embodiment in that the main drive section employs a high voltage pnp transistor 8. The operation is substantially identical to the case of the third embodiment, with the npn transistor 9 of the former being replaced with the pnp transistor 8, and the further explanation will be omitted. The new arrangement provides a breakdown voltage comparable to that of the third embodiment, while the threshold voltage is about 4 volts and the on-resistance is about 10 Ω for a current conduction of 3 mA.

Figure 8:
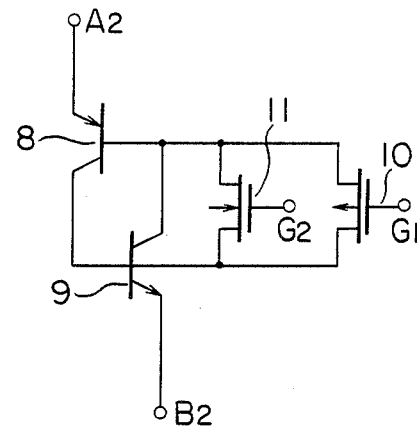

FIG. 8 shows the fifth embodiment of this invention, in which an npn transistor 9 and a pnp transistor 8 are formed in a common monocrystalline island of a dielectric isolation substrate, thereby implementing a thyristor operation. Otherwise, the npn transistor 9 and pnp transistor 8 may be formed in separate monocrystalline islands with connection being made therebetween using aluminum conductors. MOS FETs 10 and 11 have their source and drain electrodes connected in parallel so that the collector junctions of the npn transistor 9 and pnp transistor 8 are short-circuitted. Accordingly, with this embodiment llaced on the block of FIG. 6 and with the d.c. voltage source 14 replaced with an a.c. voltage source when the switch 1 is closed and a forward bias voltage is applied across A2 and B2 by the a.c. voltage source (as in FIG. 4) for the case of the control terminals G1 and G2 lower in voltage than the terminals A2 and B2, the p-channel MOS FET 10 becomes conductive to drive the npn transistor 9 and pnp transistor 8, and consequently a thyristor arrangement between A2 and B2 is turned on. In another case where the control terminals G1 and G2 are higher than A2 and B2, the n-channel MOS FET 11 becomes conductive, driving the npn transistor 9 and pnp transistor 8, and consequently the thyristor is turned on. This embodiment resembles the first and second embodiments in concurrent driving of both transistors, and slightly differs in the operating manner from the third and fourth embodiments.

This embodiment is adapted to switch an a.c. power source, which requires both the forward and reverse voltage withstanding, and all of the thyristor and n, p-channel MOS FETs 10 and 11 are made to have forward and reverse blocking abilities. Namely, the source and drain junctions can withstand 250 volts. The main circuit between A2 and B2 has a breakdown voltage of about 200 volts forward and reverse, and a breakdown voltage between the terminals A2 and B2 and the control terminals G1 and G2 is about 700 volts. The threshold voltage for turning on the main circuit is about 4 volts, and the on-resistance for conducting 30 mA is about 5.5 Ω.

Figure 9:
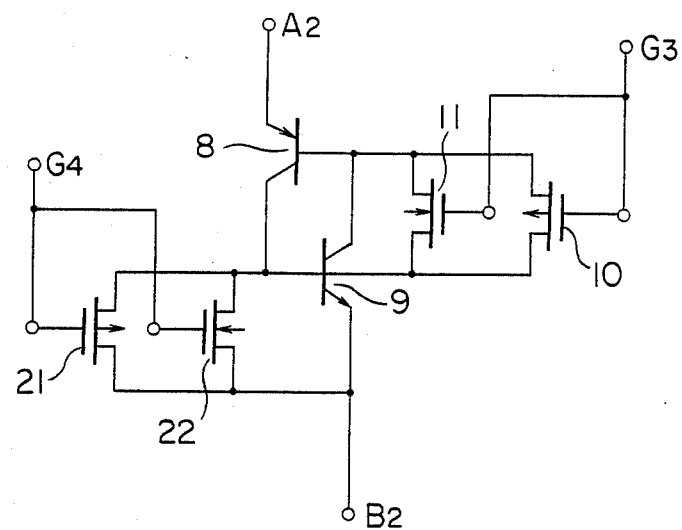

FIG. 9 shows the sixth embodiment of this invention, in which a pnp transistor 8, npn transistor 9, first p-channel MOS FET 10 and first n-channel MOS FET 11 are connected in the same manner as FIG. 8. Further provided are the second p-channel MOS FET 21 and second n-channel MOS FET 22 having their source and drain electrodes connected in parallel to the base of the npn transistor 9 (collector of the pnp transistor 8) and the emitter of the transistor 9 so as to short-circuit the reverse blocking junction, i.e., emitter junction, of the npn transistor 9. The first p-channel MOS transistor 10 and first n-channel MOS transistor 11 have their control terminals connected together to form a common control terminal G3, while the second p-channel MOS transistor 21 and second n-channel MOS transistor 22 have their control terminals connected together to form another common control terminal G4.

The FET 11 and FET 10 with their gate electrodes connected to the control terminal G3 are used to turn on the thyristor arranged between terminals A2 and B2, while the FET 22 and FET 21 with their gate electrodes connected to the control terminal G4 are used to turn off the thyristor.

A typical operational sequence of this embodiment is as follows.

(1) A forward bias voltage is applied between A2 and B2.
(2) An ON control voltage is applied to the control terminal G3 to turn on the thyristor.
(3) The control voltage is removed from the control terminal G3, and the thyristor is left in a conductive state.
(4) An OFF control voltage is applied to the control terminal G4 to turn off the thyristor.
(5) The control voltage is removed from the control terminal G4, and the thyristor is left in a non-conductive state.

The turn-on operation of this embodiment is exactly identical to the case of the fifth embodiment, and only the turn-off operation will be described in the following. This embodiment is capable of turn-off control for the conductive thyristor even if the terminals A2 and B2 are floating, by application of an OFF control voltage higher than the threshold voltage of FETs 21 and 22 to the control terminal G4, but in different operating manners depending on the voltage relation between the control terminal G4 and the terminals A2 and B2.

In case the control terminal G4 is lower in voltage than the terminals A2 and B2, the MOS FETs 21 and 22 have their source and drain voltages higher than the base voltage. Therefore, the second n-channel MOS FET 22 is non-conductive, while the second p-channel MOS FET 21 is conductive. Making the FET 21 to have a sufficiently small on resistance, the above condition causes the npn transistor section 9 of the thyristor to have its emitter junction short-circuitted. Consequently, the current flowing in the thyristor is pulled out, and it is turned off.

In another case where the control terminal G4 is higher in voltage than the terminals A2 and B2, the second p-channel MOS FET 21 is non-conductive, while the second n-channel MOS FET 22 is conductive, short-circuitting the emitter junction of the npn transistor section 9 of the thyristor, and the thyristor is turned off. When the control terminal G4 is higher than B2 and lower than A2, the operation of one of the above two cases takes place, and the thyristor is turned off.

As described, this embodiment ensures the turn-on and turn-off operations of the device even if the main terminals A2 and B2 are in a floating state. In this case, the on-controlling MOS FETs 10 and 11 are capable of control even with their relatively large on-resistance, whereas the off-controlling MOS FETs 21 and 22 need to have a relatively small on-resistance, e.g., 500 Ω or less, in order to facilitate and ensure the control. This embodiment has a breakdown voltage and turn-on threshold voltage substantially identical to those of the fifth embodiment. The turn-off control voltage to the control terminal G4 is about 6 volts, and the on-resistance is about 8 Ω for a current conduction of 30 mA.

Figure 10:
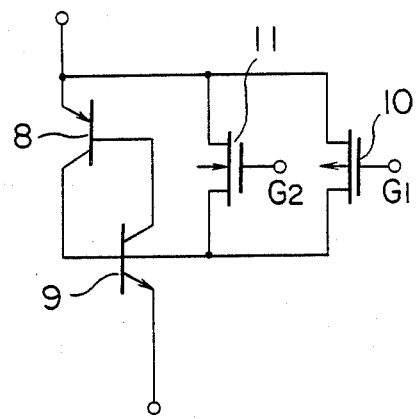
Figure 11:
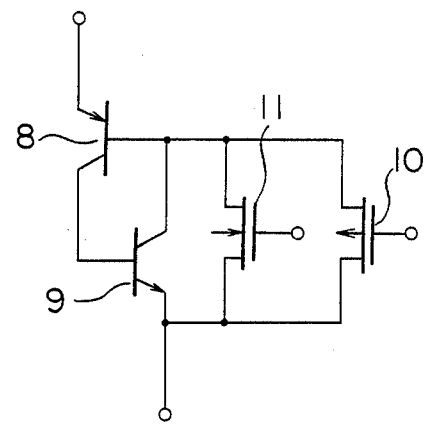

The seventh and eighth embodiments are shown in FIGS. 10 and 11, respectively. In these arrangements, the transistor collector junction is connected in series with another junction, i.e., the emitter junction of a pn transistor 8 or npn transistor 9, and thereafter connected in parallel to an n-channel MOS FET 11 and p-channel MOS FET 10. The operation of these arrangements is virtually identical to the case of parallel connection for short-circuitting only the collector junction. Namely, the case of FIG. 10 is the same as the third embodiment and the case of FIG. 11 is the same as the fourth embodiment, with the exception that once the transistors are activated a positive feedback action arises between the npn and pnp transistors, resulting in a turn-on thyristor.

Various forms of the present invention have been described, however, the invention is not limited to these embodiments, but many modifications are possible. For example, in FIGS. 2b, 8, 9, 10 and 11, integration may be made only for the base n1 of the pnp transistor 8 and the collector n2 of the npn transistor 9, or the collector n2 of the pnp transistor 8 and the base p3 of the npn transistor 9, to form a thyristor. Although the arrangements shown in FIGS. 2a, 2b, 2c, 8, 9, 10 and 11 are reverse blocking switches solely operable to turn on when biased forwardly in the case of a.c. driving, bidirectional switches can be arranged through the anti-parallel connection of each device in pair. The semiconductor devices shown in FIGS. 2a, 2b, 2c, 8, 9, 10 and 11 are not sufficiently immune to voltage noises in the forward bias direction. It is possible to enhance the noise immunity significantly without impairing the features of this invention through the attachment of a voltage noise protection circuit disclosed in Japanese Patent Examined Publication No. 53-46588. As an alternative arrangement for turning off the device, the off-controlling second p-channel MOS FET 21 and second n-channel MOS FET 22 shown in FIG. 9 may be connected to the bipolar component of FIGS. 2a, 2b, 2c, 5, 10 and 11 so as to short-circuit at least one of the reverse blocking junctions.

Figure 4:
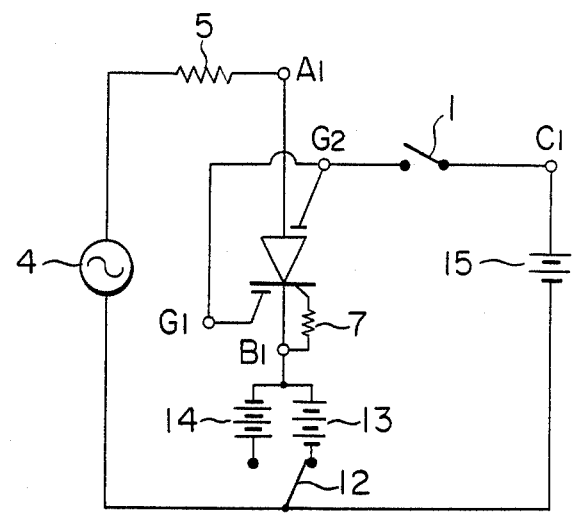
FIG. 4 is a schematic diagram showing, as an example, the external connection of the semiconductor switch circuit shown in FIGS. 2a to 2c.
Figure 12:
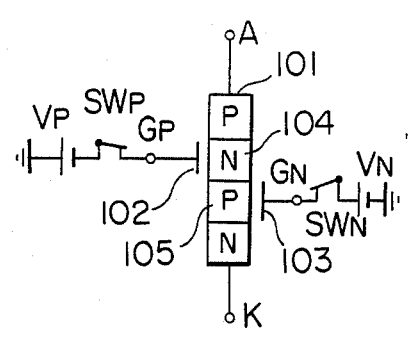
FIG. 12 is a schematic diagram showing the 12th embodiment of this invention.
Figure 13:
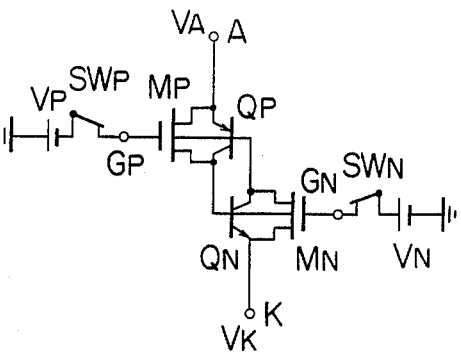
FIG. 13 is a diagram showing the equivalent circuit of the embodiment shown in FIG. 12.

FIG. 12 shows the device connection different from the case of FIG. 4, and FIG. 13 is an equivalent circuit of this connettion. In the arrangement, a pnpn switch component 101 is provided on its n base 4 with a gate electrode 102, which is in FIG. 13 the gate electrode (Gp) of a pMOS (Mp). An electrode 103 is provided on the p base 5 of the pnpn switch component 101, and it is in FIG. 13 the gate electrode (Gn) of an nMOS (Mn). The pnpn switch component 101 has a pnp transistor section Qp and an npn transistor section Qn. Vp is a voltage source for driving the pMOS (Mp) through an on-controlling switch SWp, while Vn is a voltage source for driving the nMOS (Mn) through an on-controlling switch SWn. Although the SWp and SWn are shown as contacts, they are actually transistor switches. Whereas the terminals G1 and G2 of FIG. 4 are given a gate voltage of the same polarity, the terminals Gp and Gn of FIG. 12 are given gate voltages Vp and Vn of opposite polarities.

In FIG. 13, the semiconductor switch circuit operates as follows. For the turn-on operation, the switches SWp and SWn are closed so that the voltages Vp and Vn are applied to the gate terminals Gp and Gn of the pMOS (Mp) and nMOS (Mn), respectively. In case the anode voltage VA of the pnpn switch is higher than Vp, the pMOS (Mp) becomes conductive to drive Qn, thereby turning on the pnpn switch component 101. Conversely, when the cathode voltage VK is lower than Vn, the nMOS (Mn) becomes conductive to drive Qp, thereby turning on the pnp switch component 101. The two MOS transistors Mp and Mn operate to be conductive with their source electrodes being as an anode terminal A and cathode terminal K, respectively. On this account, the driving voltage sources Vp and Vn do not need to have voltages larger in absolute value than the voltage amplitude of the load circuit, whereby the drive circuit can be simplified considerably. As an extreme example, the switch component 101 can be driven to turn on with Vp=0 volt and Vn=0 volt. The pnpn switch component 101 is turned on in a mode of voltage drive, and therefore no current leaks from the drive circuit to the load circuit, whereby an ideal switch is achieved.

For the turn-off operation, the two switches SWp and SWn are opened so that the voltage drive on the MOS transistors Mp and Mn ceases, and the Mp and Mn are made non-conductive. Due to the self-holding ability of the pnpn switch component 101, it turns off when its current falls to zero. Thereafter because of the absence of on-drive, the switch 101 stays in an off state even if a forward voltage is applied across it.

Figure 14:
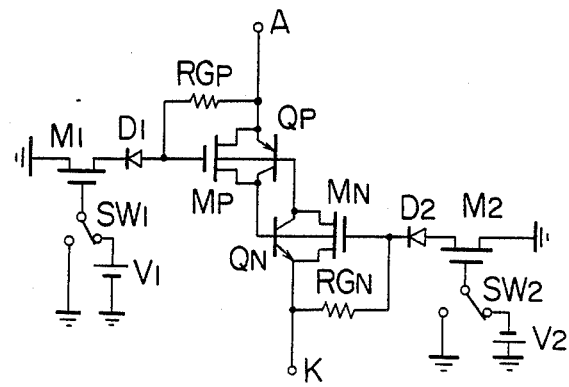
FIGS. 14, 15 and 16 are diagrams showing the equivalent circuits of the 13th, 14th and 15th embodiments of this invention, respectively.

FIG. 14 is an equivalent circuit showing the ninth embodiment of this invention, in which components identical to those of FIG. 13 are referred to by the common symbols. In the arrangement, M1 is an n-MOS FET equivalent to the switch SWp in FIG. 13, while M2 is a p-MOS FET equivalent to the switch SWn in FIG. 13. V1 is a voltage source for driving the n-MOS FET (M1) through a switch SW1, while V2 is another voltage source for driving the p-MOS FET (M2) through a switch SW2. Diodes D1 and D2 are used for blocking reverse voltage application to the M1 and M2, and high-resistance resistors RGp and RGn are used for providing fixed gate voltages for the p-MOS FET (Mp) and n-MOS FET (Mn), respectively.

The basic operation of this arrangement is the same as of FIG. 13. In the turn-on operation, the n and p-MOS FETs (M1, M2) become conductive simultaneously, causing the gates of the p and n-MOS FETs (Mp, Mn) to have a ground voltage. With the anode (A) of the pnpn switch component being positive, the p-MOS FET (Mp) becomes conductive to turn on the pnpn switch component, while with the cathode (K) being negative, the n-MOS FET (Mp) becomes conductive to turn on the pnpn switch component. The resistors RGp and RGn for fixing the gate voltage can have an extremely large resistance, making the leakage current from the drive circuit to the load circuit during the on-state of the pnpn switch negligibly small in a practical sense. The diodes D1 and D2 can be eliminated depending on the magnitude of the load voltage.

Figure 15:
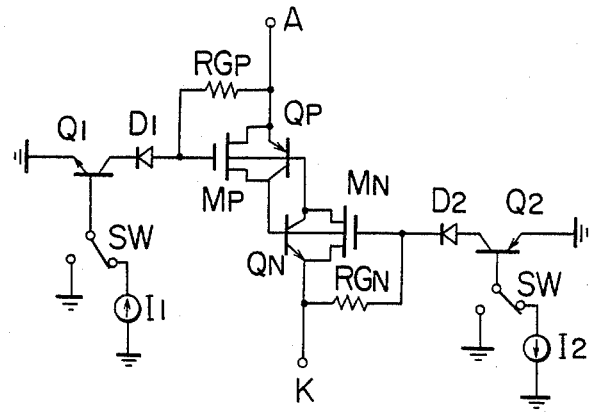

FIG. 15 is an equivalent circuit showing a different use of the ninth embodiment, in which the driving n-MOS FET (M1) in FIG. 14 is replaced with an npn transistor Q1 which is driven by a current source I1, and the driving p-MOS FET (M2) in FIG. 14 is replaced with a pnp transistor Q2 which is driven by a current source I2. The use of bipolar transistors for the turn-on drive allows a sensitive turn-on operation.

Figure 16:
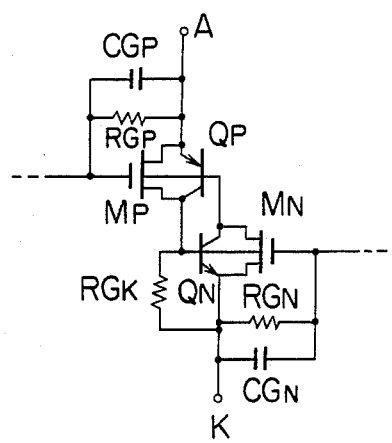

FIG. 16 shows in the manner of equivalent circuit the tenth embodiment of this invention, in which is deviced a means for preventing erroneous turn-on of the pnpn switch component. A resistor RGK is connected between the base and emitter of the npn transistor Qn constituting in part the pnpn switch component, and it is effective for preventing erroneous turn-on by a leakage current flowing through the pn junction. Capacitors CGp and CGn are connected between the gate and source of the p-MOS FET (Mp) and n-MOS FET (Mn), respectively, and they are effective for preventing the pnpn switch component from turning on erroneously in response to a drive of the p-MOS FET (Mp) and n-MOS FET (Mn) through the capacitance of the load circuit by application of a sharp rising voltage.

Figure 17:
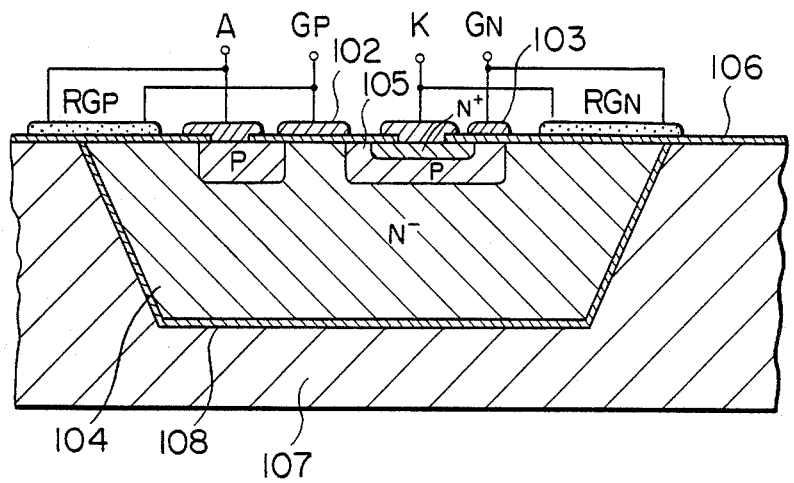
FIG. 17 is a partial cross-sectional view of the semioonductor device integrating the 14th embodiment shown in FIG. 15 excluding the drive circuit section.

FIG. 17 is a cross-sectional view of the monolithic integration of the circuit arrangement shown in FIG. 15 excluding the drive circuit. Through the use of a known dielectric isolation technique, a pnpn structure is created within an n-type monocristalline island 104 isolated by an oxide film 108 in a silicon polycristalline body 107. The p-MOS FET (Mp) has its gate electrode Gp formed on the n-base 104 with an oxide film 106 interleaved therebetween, while the n-MOS FET (Mn) has its gate electrode Gn formed through the oxide film 106 over the p-base 105 The resistors RGp and RGn can also be made of polycristalline silicon layer formed on the oxide fimm 106. As shown, the inventive semiconductor switch circuit can readily be integrated in a semiconductor chip.

As described above, the present invention enables a current-control bipolar component to be controlled by a voltage-control unipolar component The circuit is fablicated in a monolithic structure, with a d.c. isolation being made between the control section and the main drive section. Moreover, the switching device can surely be controlled even in a floating state of the unipolar components, and a control current needed can be made smaller.

We claim:

1. A semiconductor switch circuit of field-drive type comprising:
   a bipolar transistor having at least one forward blocking junction and at least one reverse blocking junction; and
   a p-channel insulated gate field effect transistor (IGFTT) and an n-channel IGFET connected across said bipolar transistor so as to short-circuit at least one of said forward blocking junctions.

2. A semiconductor switch circuit according to claim 1, wherein said bipolar transistor is one of two transistors constituting a thyristor.

3. A semiconductor switch circuit according to claim 1, wherein said p-channel and n-channel IGFET's have their control terminals connected with each other.

4. A semiconductor switch circuit according to claim 1, wherein said p-channel and n-channel IGFETs are connected in parallel with each other.

5. A semiconductor switch circuit of field-drive type comprising:
   a thyristor having at least one forward blocking junction and at least one reverse blocking junction;
   a first p-channel IGFET and a first n-channel IGFET connected across said thyristor to shot-circuit said forward blocking junction; and
   a second p-channel IGEET and a second n-channel IGFET connected across said thyristor to short-circuit said reverse blocking junction.

6. A semiconductor switch circuit according to claim 5, wherein said first p-channel and n-channel IGFETs have their control terminals connected with each other and said second p-channel and n-channel IGFETs have their control terminals connected with each other.

7. A semiconductor switching circuit according to claim 5, wherein said first p-channel and n-channel IGFETs are connected in parallel with each other and said second p-channel and n-channel IGFETs are connected in parallel with each other.

8. A semiconductor switch circuit comprising:
a thyristor having a pnp transistor and an npn transistor connected so as to cause positive feedback; and
a p-channel IGFET and an n-channel IGFET connected between a collector and an emitter of the pnp transistor of said thyristor.

9. A semiconductor switch circuit according to claim 5, wherein gate electrodes of both the IGFETs are connected with each other.

10. A semiconductor switch circuit comprising:
a thyristor having a pnp transistor and an npn transistor connected so as to cause positive feedback; and
a p-channel IGFET and an n-channel IGFET connected between a collector and an emitter of the npn transistor of said thyristor.

11. A semiconductor switch circuit according to claim 10, wherein gate electrodes of both the IGFETs are connected with each other.

12. A semiconductor switch circuit comprising:
two bipolar components having different polarities from one another, each of said bipolar components having a base, a collector and an emitter, a base of one of said two bipolar components and a collector of the other of said two bipolar components being connected with each other, and a base of said other bipolar component and a collector of said one bipolar component being connected with each other;
a unipolar component of one conductivity type having its source and drain connected between an emitter and the collector of said one bipolar component; and
a unipolar component of another conductivity type having its source and drain connected between an emitter and the collector of said other bipolar component.

* * * * *